(12) United States Patent
Wityak et al.

(10) Patent No.: US 9,011,652 B2
(45) Date of Patent: *Apr. 21, 2015

(54) ROTARY TARGET BACKING TUBE BONDING ASSEMBLY

(75) Inventors: George Michael Wityak, Albuquerque, NM (US); Luther Wilburn Cox, Albuquerque, NM (US)

(73) Assignee: Materion Advanced Material Technologies and Services Inc., Buffalo, NY (US)

( * ) Notice: Subject to any disclaimer, the term of this patent is extended or adjusted under 35 U.S.C. 154(b) by 908 days.

This patent is subject to a terminal disclaimer.

(21) Appl. No.: 13/179,825

(22) Filed: Jul. 11, 2011

(65) Prior Publication Data

US 2012/0006680 A1 Jan. 12, 2012

Related U.S. Application Data

(60) Provisional application No. 61/363,308, filed on Jul. 12, 2010.

(51) Int. Cl.
C23C 14/34 (2006.01)
B23K 37/04 (2006.01)
H01J 37/34 (2006.01)

(52) U.S. Cl.
CPC ......... *C23C 14/3407* (2013.01); *B23K 37/0443* (2013.01); *H01J 37/342* (2013.01); *H01J 37/3435* (2013.01)

(58) Field of Classification Search
CPC ............ B23K 37/0443; C23C 14/3407; H01J 37/342; H01J 37/3435

USPC .............. 204/298.09, 298.12, 298.21, 298.22
See application file for complete search history.

(56) References Cited

U.S. PATENT DOCUMENTS

| | | | |
|---|---|---|---|
| 6,365,010 B1 | 4/2002 | Hollars | |
| 6,409,897 B1 | 6/2002 | Wingo | |
| 6,787,011 B2 | 9/2004 | Ueda et al. | |
| 7,922,066 B2 | 4/2011 | Nolette et al. | |
| 2002/0096430 A1 | 7/2002 | Lupton et al. | |
| 2005/0224342 A1* | 10/2005 | Landgraf et al. | 204/298.12 |
| 2006/0157346 A1 | 7/2006 | Cnockaert et al. | |
| 2007/0023275 A1 | 2/2007 | Tanase et al. | |
| 2007/0062809 A1 | 3/2007 | Nolette et al. | |
| 2007/0074969 A1 | 4/2007 | Simpson et al. | |

(Continued)

FOREIGN PATENT DOCUMENTS

| | | |
|---|---|---|
| DE | 102006017455 A1 | 10/2007 |
| DE | 102007044651 A1 | 4/2009 |

(Continued)

OTHER PUBLICATIONS

International Search Report from corresponding PCT Application No. PCT/US2011/043532 (2 pages).

(Continued)

*Primary Examiner* — Rodney McDonald
(74) *Attorney, Agent, or Firm* — Hiscock & Barclay, LLP

(57) ABSTRACT

A rotary sputtering target bonded to a backing tube such that the bonding material is applied only proximate the ends of the rotary sputtering target and is also between the target and the backing tube to form a gap between the rotary sputtering target and the backing tube and a device for bonding a rotary sputtering target to a backing tube.

15 Claims, 13 Drawing Sheets

(56) References Cited

U.S. PATENT DOCUMENTS

| | | | |
|---|---|---|---|
| 2009/0152108 A1* | 6/2009 | Huttl et al. | 204/298.12 |
| 2009/0250337 A1 | 10/2009 | Simons et al. | |
| 2011/0005923 A1 | 1/2011 | Schnappenberger et al. | |
| 2011/0005925 A1 | 1/2011 | Schnappenberger et al. | |
| 2011/0240467 A1 | 10/2011 | Itoh et al. | |

FOREIGN PATENT DOCUMENTS

| | | |
|---|---|---|
| EP | 1813695 A1 | 8/2007 |
| EP | 2163662 A1 | 3/2010 |
| EP | 1813695 | 5/2011 |
| JP | 209476 A | 8/1990 |
| JP | 3974541 A | 9/2003 |
| JP | 2005-520935 A | 7/2005 |
| JP | 2008-505250 A | 2/2008 |
| JP | 2008-60351 A | 3/2008 |
| JP | 2009-513818 A | 4/2009 |
| JP | 2010-070842 A | 4/2010 |
| JP | 2010-100930 A | 5/2010 |
| WO | WO 2007/041425 A2 | 4/2007 |
| WO | 2009/036910 | 3/2009 |

OTHER PUBLICATIONS

Supplementary European Search Report from corresponding European Application No. PCT/US2011/043532 (2 pages).

Office Action issued from correspondence Japanese Patent Application No. 2013-519740.

International Search Report for related PCT Application No. PCT/US2013/052519, dated Oct. 18, 2013.

* cited by examiner

ROTARY TARGET BACKING TUBE BONDING ASSEMBLY

FIELD OF THE INVENTION

The invention relates to the field of rotary sputtering targets. More particularly, the invention relates to attaching target material to a backing tube assembly.

BACKGROUND OF THE INVENTION

Sputter depositions are reproducible and are also simple for process automation. Rotary sputtering targets have been shown to improve the sputtering process. By rotating the sputtering material, the target material is sputtered in a more continuous uniform fashion than when compared to planar targets. Rotary sputtering targets are typically formed in a cylindrical shape.

Of particular concern with rotary sputtering targets, are with the use of soft or malleable material having a high weight to strength ratio. Such materials include sliver and gold. As more material is sputtered away, the rotary sputtering target becomes thinner and thus more likely to flex or break during rotation. To alleviate this problem typically the rotary sputtering target is supported by a backing tube.

The backing tube is constructed of a material that can withstand the sputtering process while retaining its shape. The backing tube supports the rotary sputtering target thereby reducing excess flexing of the target material.

Another advantage of using a backing tube is that cooling fluid can be passed through the backing tube to cool the target during the sputtering process. For cooling to be effective it is important that there is sufficient thermal contact between the cooling fluid and the rotary sputtering target. Current technology for the assembly of rotary sputtering targets attach the backing tube in such a manner as to prevent any gap between the inners surface of the rotary sputtering target and the outer surface of the backing tube to ensure sufficient thermal contact between the backing tube and the target material.

Generally, backing tubes are made from a material having low thermal conductive properties. This is especially important for rotary target material having a low melting point. Using a backing tube having a high thermal conductivity could result in thermal gain which would lead to an incipient melting situation. This would cause a short in the sputtering process and dangerous arching in the system.

A further advantage of using backing tubes is that the backing tube is formed from a material having a lower cost than the target material. The backing tube allows for more of the target material to be sputtered without deformation and therefore, produces higher yields when compared to systems lacking a backing tube.

There exist various techniques for attaching the rotary sputtering target to the backing tube. One such technique is to cast the rotary sputtering target onto the backing tube. This in essence creates a complete structure that is very rigid. However, casting is only feasible when using a castable rotary sputtering target material. Casting directly on the backing tube has its drawbacks. For example, casting often results in variable grain size and has an inherent porosity that is created from the volume changes of the liquid to solid transition. These variables and defects are detrimental to target system.

Another method for attachment of the rotary sputtering target to the backing tube is by use of a mechanical, such as by the use of sleeves. However, this methodology creates problems in the sputtering process. During the sputtering process heat is generated at the outer surface of the target material due to the plasma created at the surface. Heat is then transferred into the bulk of the target through to the inner surfaces of the target. To cool the inner surfaces, a coolant typically flows through the backing tube. However, due to thermal expansion of the sleeves relative to that of the target material and the backing tube, the inner surface of the rotary sputtering target may lose contact with the backing tube, and thus limit the cooling effect achieved by being in contact with the backing tube. Once contact with the backing tube is broken thermal expansion increases, exacerbating the problem even further.

Another technique for attaching the rotary sputtering target to the backing tube is by use of a bonding material. An adhesive or metal alloy is placed between the inner surface of the rotary sputtering target and the outer surface of the backing tube. This creates a strong bond between the two surfaces and assists in cooling transfer. However, care must be taken when flowing the adhesive between the rotary sputtering target and the backing tube to ensure adequate bonding strength. Reuse of the backing tube is a laborious process, as it is difficult to remove the remaining target material from a sufficiently secure bond.

One method to improve cooling transfer to the target material is to modify the backing tube. One method is to remove material creating depressions on the inner surface of the backing tube such as discussed in WO 2009/036910 to Preissler et al.

Another method to improve cooling transfer is to perforate the backing tube. Such perforations are discussed in EP1813695 to De Bosscher, the contents of which are incorporated herein by reference. The perforations in the backing tube allow for direct contact of the cooling fluid with the target material. If direct contact of the cooling fluid is not desired, a membrane that is leak proof and thermally conductive is used between the target material and the backing tube. To attach the rotary sputtering target to the backing tube, sleeves having vacuum to water seals are used to both support the target material and prevent leakage of the cooling fluid. Alternatively, the rotary sputtering target is milled while the backing tube is contained completely within the sleeve.

Having a low cost and high weight to strength ratio backing tube is desired.

Additionally, being able to reliably bond rotary sputtering targets to backing tubes is desired.

Moreover, being able to attaching a rotary sputtering target to a backing tube for easy removal and reuse of the backing tube is desired.

Also, having a jig for repeatable bonding a rotary sputtering target to a backing tube is desired.

In addition, directly contacting cooling fluid with a rotary sputtering target to improve cooling in particular circumstances is desired.

SUMMARY OF THE INVENTION

The invention comprises, in one form thereof, a rotary sputtering target bonded to a backing tube such that the bonding material is applied only proximate the ends of the rotary sputtering target and is of a thickness to otherwise form a gap between the rotary sputtering target and the backing tube.

In another form, the invention includes a backing tube having perforations to allow improved thermal transfer of cooling properties to the rotary sputtering target. The perforated backing tube allows the cooling fluid to pass through the perforations in the backing tube to directly contact the inside surface area of the target for more effective heat transfer.

In yet another form, the invention includes a jig for bonding a rotary sputtering target bonded to a backing tube. The jig holds the backing tube and rotary sputtering target in place to allow for the application of bonding material at their respective ends.

More particularly, the jig includes a heating plug to heat the inner surface of the backing tube along with a variable temperature band to both heat and cool the outer surface of the target material during the application and curing of the bonding material. Optionally, the jig further includes a protrusion to create a gap between the rotary sputtering target and the backing tube to allow for the application of the bonding material.

In another form, the invention includes a method for bonding a rotary sputtering target to a backing tube. The method including placing the backing tube and rotary sputtering target in a jig and applying a bonding material that is between the rotary sputtering target and the backing tube and is also proximate the end of the rotary sputtering target, and then inverting the rotary sputtering target and backing tube to apply the bonding material at the other end.

An advantage of the present invention is that use of the jig provides repeatable and reliable bonding of the rotary sputtering target to the backing tube A further advantage of the present invention is that applying only adhesive to the ends of the area between the backing tube and the rotary sputtering target, once the rotary sputtering target has been consumed, the ability to remove from the backing tube is improved An even further advantage of the present invention is that the perforations in the backing tube allow for improved thermal transfer of the cooling fluid to the rotary sputtering target.

BRIEF DESCRIPTION OF THE DRAWINGS

The present invention is disclosed with reference to the accompanying drawings, wherein.

Corresponding reference characters indicate corresponding parts throughout the several views. The examples set out herein illustrate several embodiments of the invention but should not be construed as limiting the scope of the invention in any manner.

DETAILED DESCRIPTION

The discontinuous adhesive layer formed by use of the bonding jib allows for sufficient bonding of a rotary target material to a backing tube, while allowing for easy removal of the remaining target material once the target has been consumed to acceptable limits. In one embodiment, utilizing a perforated backing tube, the discontinuous adhesive layer allows for direct contact of cooling fluid with the inner surface of the target material during sputtering processes.

The size of the rotary sputtering materials and the backing tube can vary greatly depending on the choice of material and the sputtering system. As sputtering systems evolve, so does the preferred size of the target material and backing tube. Therefore, it is understood that the dimensions given herein are for explanatory purposes only and are not intended to be limiting on the invention as described.

Figure 1:
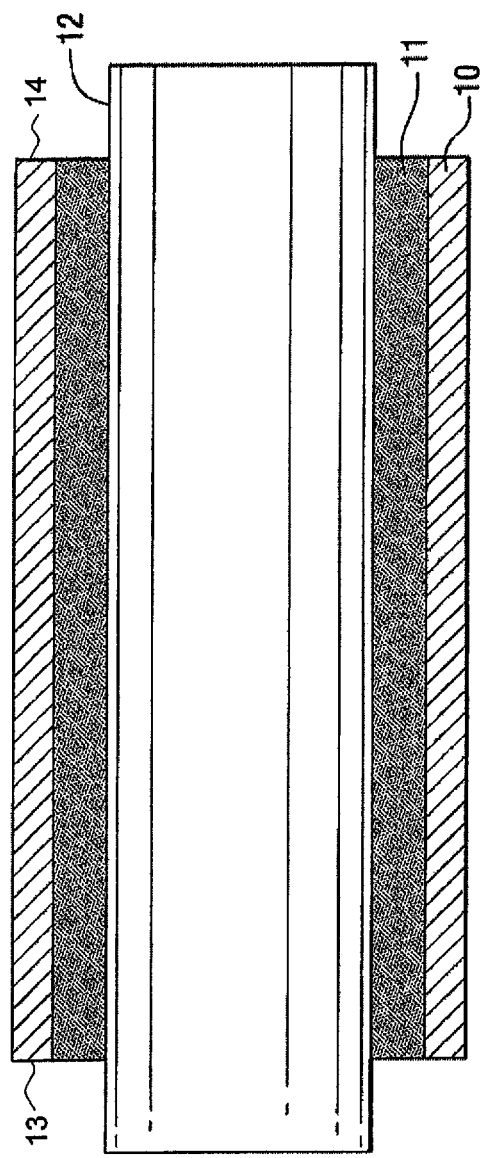
FIG. 1 is cross-sectional view of a conventional backing tube have a rotary target adhered thereto according to the prior art.

Referring to FIG. 1, there is shown a rotary sputtering target bonded to a backing tube according to the prior art. The target material 10 is bonded to the backing tube 12 by the bonding material 11. The bonding material 11 extends from the first end 13 of the target material 10 in a continuous fashion to the second end 14.

Figure 2:
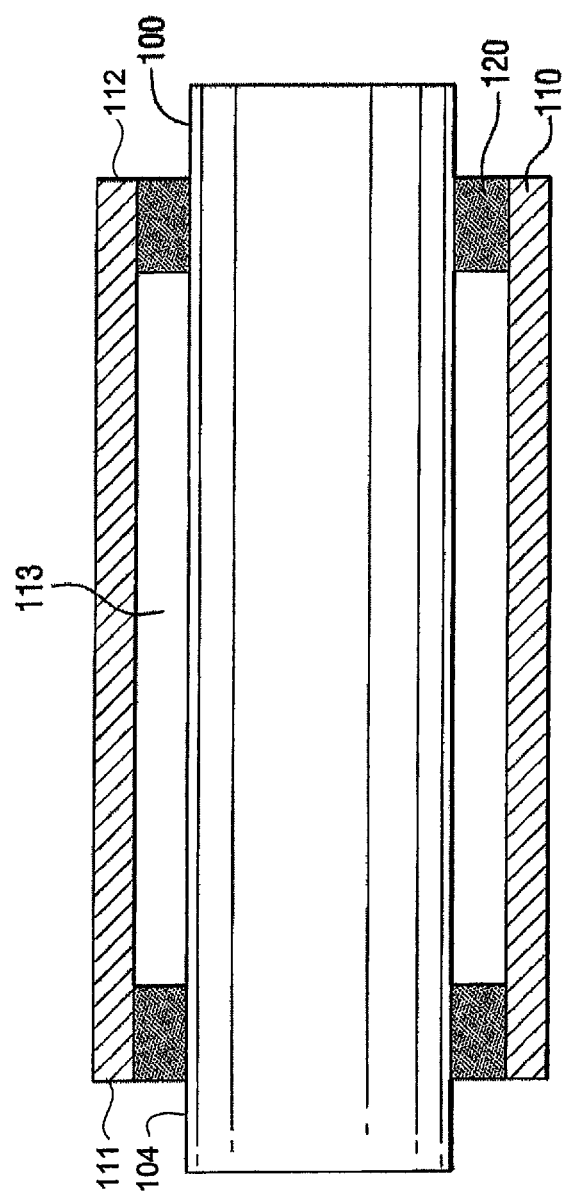
FIG. 2 is a cross-sectional view of a backing tube have a rotary target adhered thereto according to one embodiment.

Referring to FIG. 2, there is a rotary sputtering target bonded to a backing tube according to one embodiment of the present invention. The target material 110 is bonded to the backing tube 100 by the target bonding material 120. The bonding material 120 is discontinuous in that it is only applied near the first end 111 and the second end 112. Thereby creating a gap 113 between the target material 110 and the backing tube 100. It is noted that the size of the gap 113 is exaggerated for illustrative purposes. In practice, the gap is generally less than 3 mm, with particular uses having a gap that is less than 1 mm.

Practically any material can be supplied as a rotary sputtering target material. Suitable rotary sputtering target materials include, but are not limited to, alloys, mixtures, pure metals, ceramics, oxides, nitrides, borides, carbides, fluorides and sulfides. In one embodiment, a metal target is sputtered by oxidizing or nitriding sputtered metal ions to deposit an oxide or nitride film layer of the desired composition. It is understood that these sputtering techniques do not constitute an exhaustive list of possible sputtering techniques and that particular sputtering techniques will depend on the sputtering target material and be known to those skilled in the art. Current systems employ rotary sputtering targets having a length from about 6" to 152", an inner diameter from about 2" to 6" and an outer diameter from about 4" to 9". It is understood that as sputtering systems change these dimensions are not intended to be limiting.

The bonding material is used to bond the rotary sputtering target to the backing tube. The bonding material generally has a high strength to weight ratio compared to the sputtering material, however this is not necessary in all applications. Suitable bonding materials include, but are not limited to solder type materials, bismuth type materials, foils, indium, indium/tin, silver/tin and similar alloys. The bonding material should be selected based on the material properties of the rotary target and the backing tube. In one embodiment the bonding material not only bond the rotary sputtering target to the backing tube, but also provides a vacuum seal. In yet another embodiment the bonding material forms a seal sufficient to resist the pressure of the cooling fluid during the sputtering process.

The backing tube material is generally selected from a material having a high strength and a low cost. The backing tube must be constructed of a material, and have a thickness, suitable to support the weight of the rotary sputtering target. Furthermore, the backing tube should be vacuum compatible so as to not go through a phase change in systems utilizing vacuum chambers. In selecting a backing tube it important to use a material that will allow the bonding material to create a sufficiently strong bond. Generally, backing tubes are constructed from a non-magnetic material so as to not effect the magnetic field often used in the sputtering process. Suitable backing tube materials include, but are not limited to stainless steel, aluminum and titanium. The backing tube will generally have size dimensions similar to those of the rotary sputtering target. The backing tube may extend in length beyond the rotary sputtering target for attachment to the sputtering system. Additionally, the outer diameter of the backing tube should be close to the inner diameter of the rotary sputtering target. In one embodiment, the difference between the outer diameter of the backing tube and the inner diameter of the rotary sputtering target is less than 3 mm. In another embodiment, the difference between the outer diameter of the backing tube and the inner diameter of the rotary sputtering target is less than 1 mm.

Figure 11:
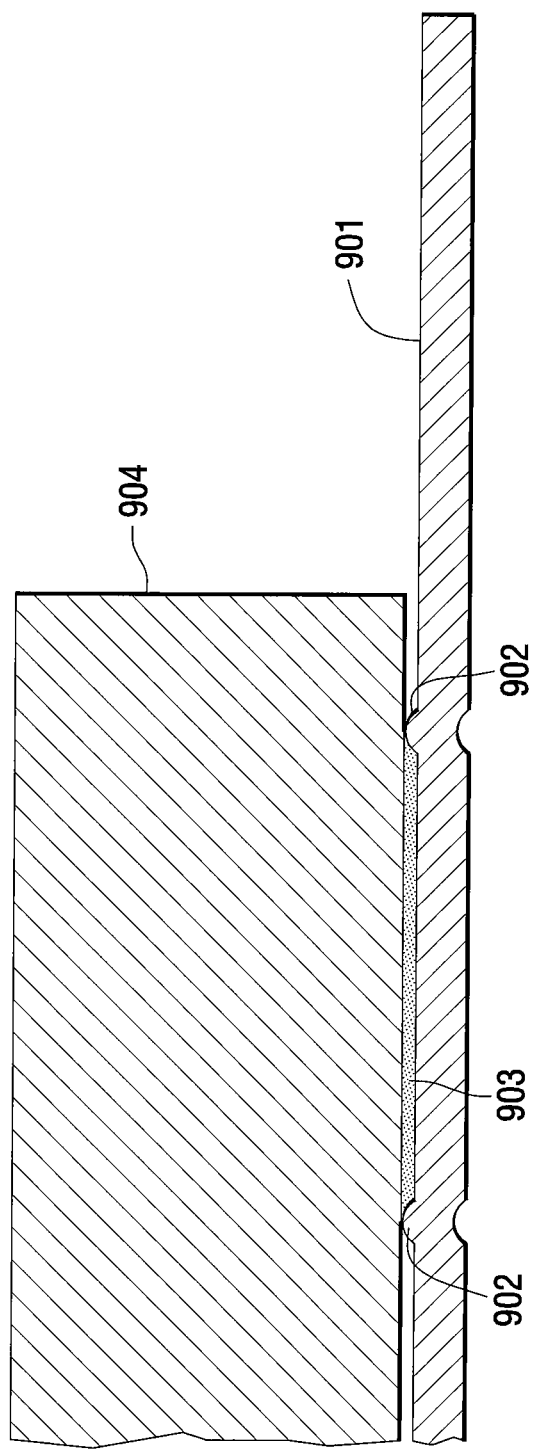
FIG. 11 is a cross-sectional view of a backing tube having adhesive ridges according to one embodiment.

Referring to FIG. 11 there is shown an backing tube according to another embodiment. The backing tube 901 has adhesive ridges 902 to contain the adhesive 903. The adhesive ridges 902 retain the adhesive 903 to the area between the two adhesive ridges 902 to facilitate bonding of the target 904. In another embodiment, the backing tube has only one adhesive ridge proximate each end. It is understood that any number of adhesive ridges may be employed without detracting from the scope of the invention. Although both sides of the backing tube are shown to have ridges, it is understood that the backing tube could be formed with only a ridge on the outer diameter, leaving the inner diameter smooth.

Optionally, the backing tube is coated with a release agent to facilitate the release of the target material from the backing tube after use. The release agent is applied proximate to the area of the backing tube where the bonding material is applied. The release agent impedes the bonding material from bonding to the backing tube in the areas in which the release agent is applied. In addition to facilitating the release of the target material, the release agent also helps the bonding material flow into the gap created between the backing tube and the rotary sputtering target. Those skilled in the art will understand that the temperature of the particular sputtering system must be considered in selecting an appropriate release agent. Suitable release agents include, but are not limited to bees wax, graphite based alcohols, graphite based paints, dry graphite lubricants such as Acheson DAG 154, and other compounds commonly used throughout the solder industry to prevent the bonding material from adhering to areas of the backing tube not intended to have bonding material. In one embodiment, graphite based alcohols are used for their ease of application. The alcohol is evaporated during the heating process leaving behind a graphite film that prevents the adhesion of the bonding material.

Referring again to FIG. 2, the rotary sputtering target material 110 is bonded to the backing tube 100 such that a portion of the backing tube is exposed 104. The exposed portion allows for attachment to the sputtering system and the length of the exposed portion depends and the particular sputtering system used. The bonding material 120 is applied to the ends of the rotary sputtering target material 110 such that only a portion is bonded to the backing tube. In one embodiment the bonding material extends from the end of the rotary sputtering target and less than along the inner surface 114. In one embodiment, the bonding material begins proximate one end of the rotary sputtering target and extends less than ⅓ the total length of the rotary sputtering target. In another embodiment, the bonding material begins proximate one end of the rotary sputtering target and extends less than ⅕ the total length of the rotary sputtering target. In the embodiments where a perforated backing tube is used, the bonding material may extend past the perforations and the rotary sputtering target extends beyond the end of the perforations such that the bonding material creates a fluid resistant seal.

Figure 3:
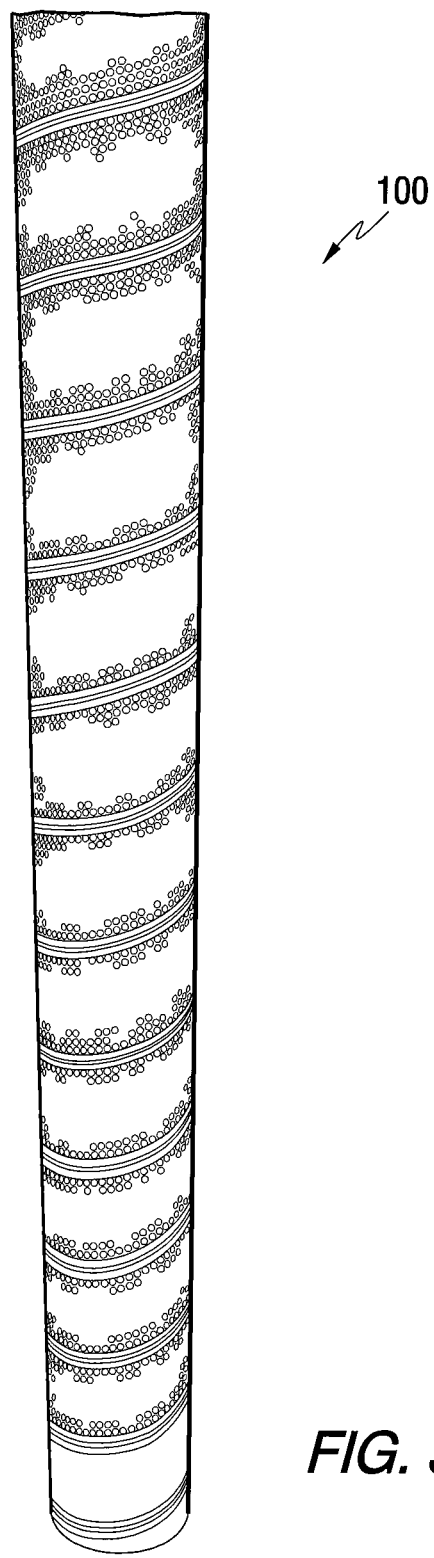
FIG. 3 is a graphical representation of a perforated backing tube.
Figure 4:
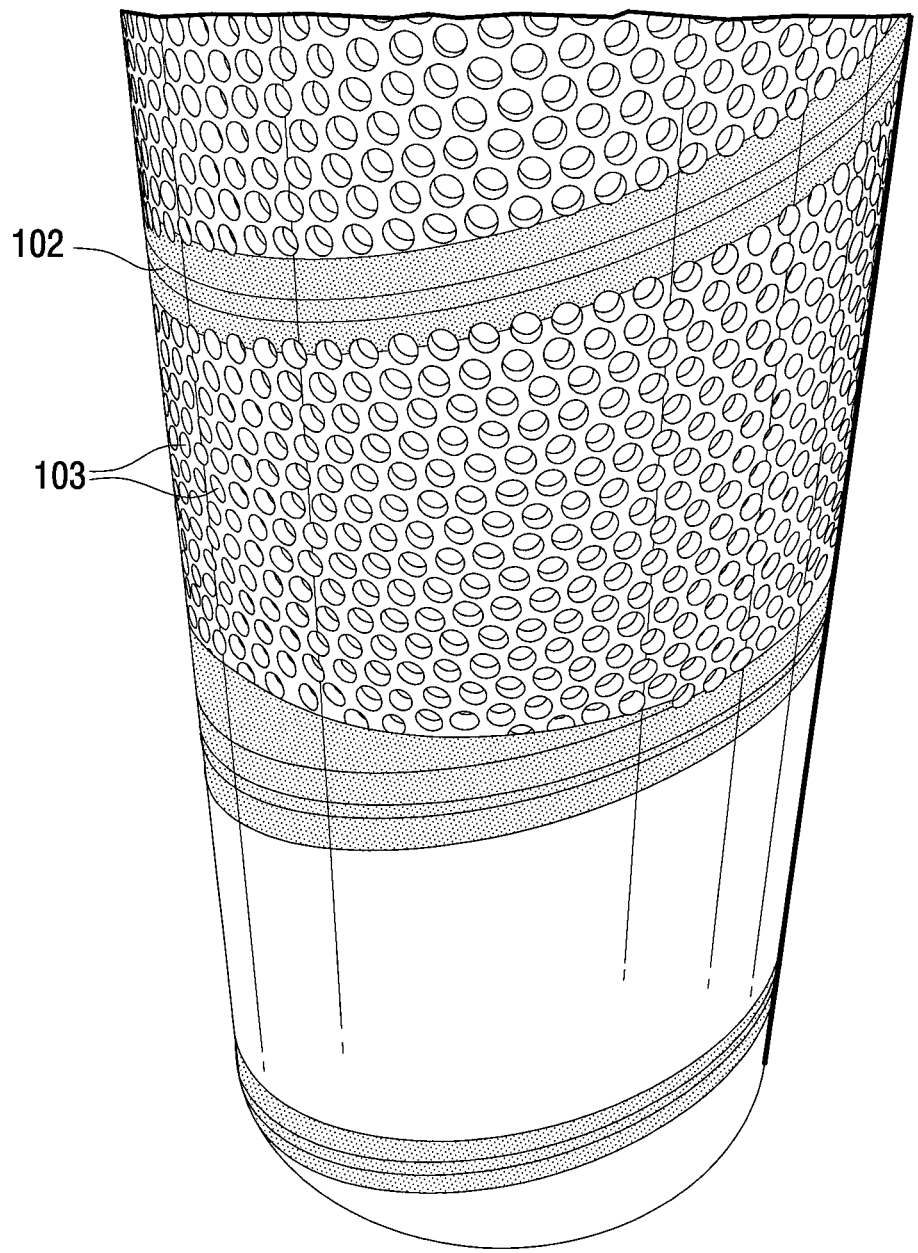
FIG. 4 is a graphical representation of an end collar of a perforated backing tube.
Figure 5:
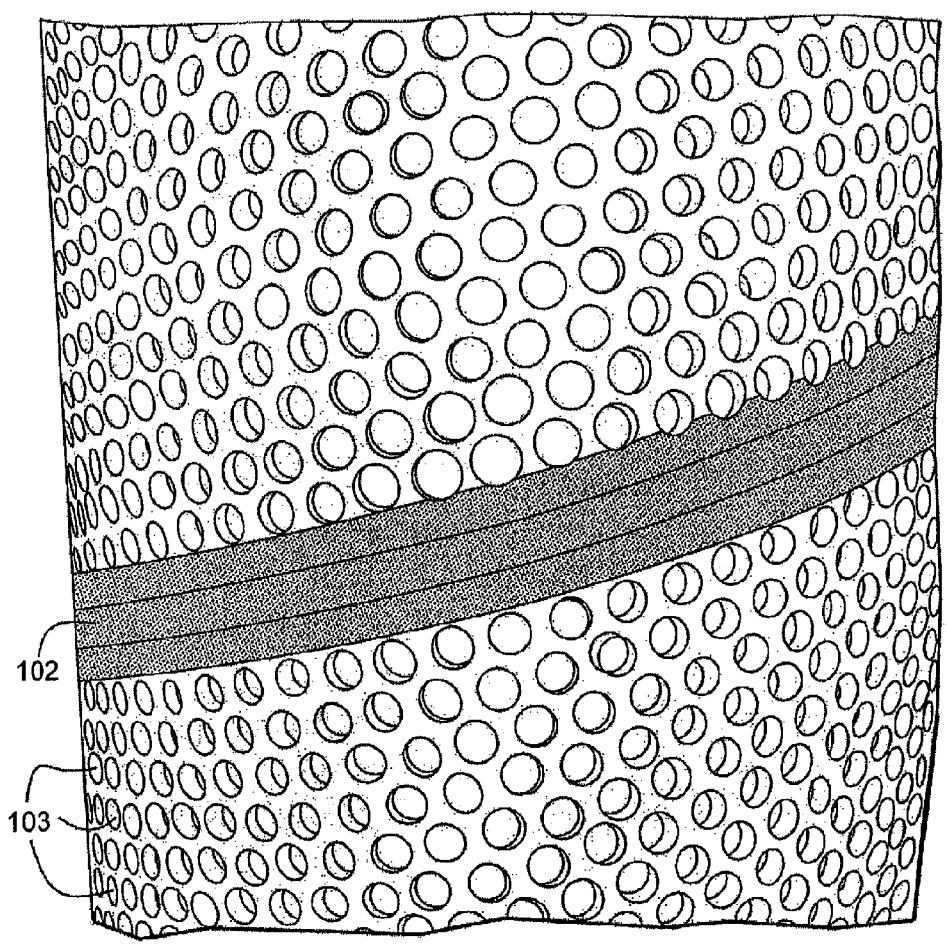
FIG. 5 is a graphical representation of a perforated backing tube.

Referring now to FIGS. 3-5, there is shown a backing tube according to one embodiment. The backing tube 100 has a series of perforations 103 to allow cooling fluid to directly contact the target material bonded to the backing tube. It is understood that the perforations can be any size, shape or pattern so as to allow cooling fluid to pass through the perforations while maintaining the integrity of the backing tube. The perforations can be holes, slots, slits or any opening to allow the cooling fluid to pass through the backing tube and contact the inner surface of the rotary sputtering target. The perforations can be of various size to optimize flow characteristics. FIG. 3 depicts a backing tube 100 having perforations on only a portion of the surface. It is understood that more or less perforations may be utilized depending on the application.

Optionally, the backing tube 100 is formed from a sheet material that is helically wound forming a seam 102 in a helical shape around the backing tube. By utilizing a seam 102 the manufacturing process is streamlined and backing tubes of various lengths can be formed. Although the backing tube is shown having a seam, it is understood that the backing tube could be formed without the helical seam. For example, the backing tube could be formed from a sheet material and rolled forming a seam along the cylindrical length of the backing tube. Alternatively, the backing tube can be formed from a core material resulting in no seam. It is further understood that the backing tube could have additional perforations along the area shown having the seam, or have no perforations at all.

Each end of the backing tube 100 has an end collar. In one embodiment the end collar is the exposed end of the backing tube 100. The end collar allows for attachment of the backing tube 100 to a sputtering system. Optionally, the end collar includes attachments for the intake and exhaust of cooling fluid.

Figure 6:
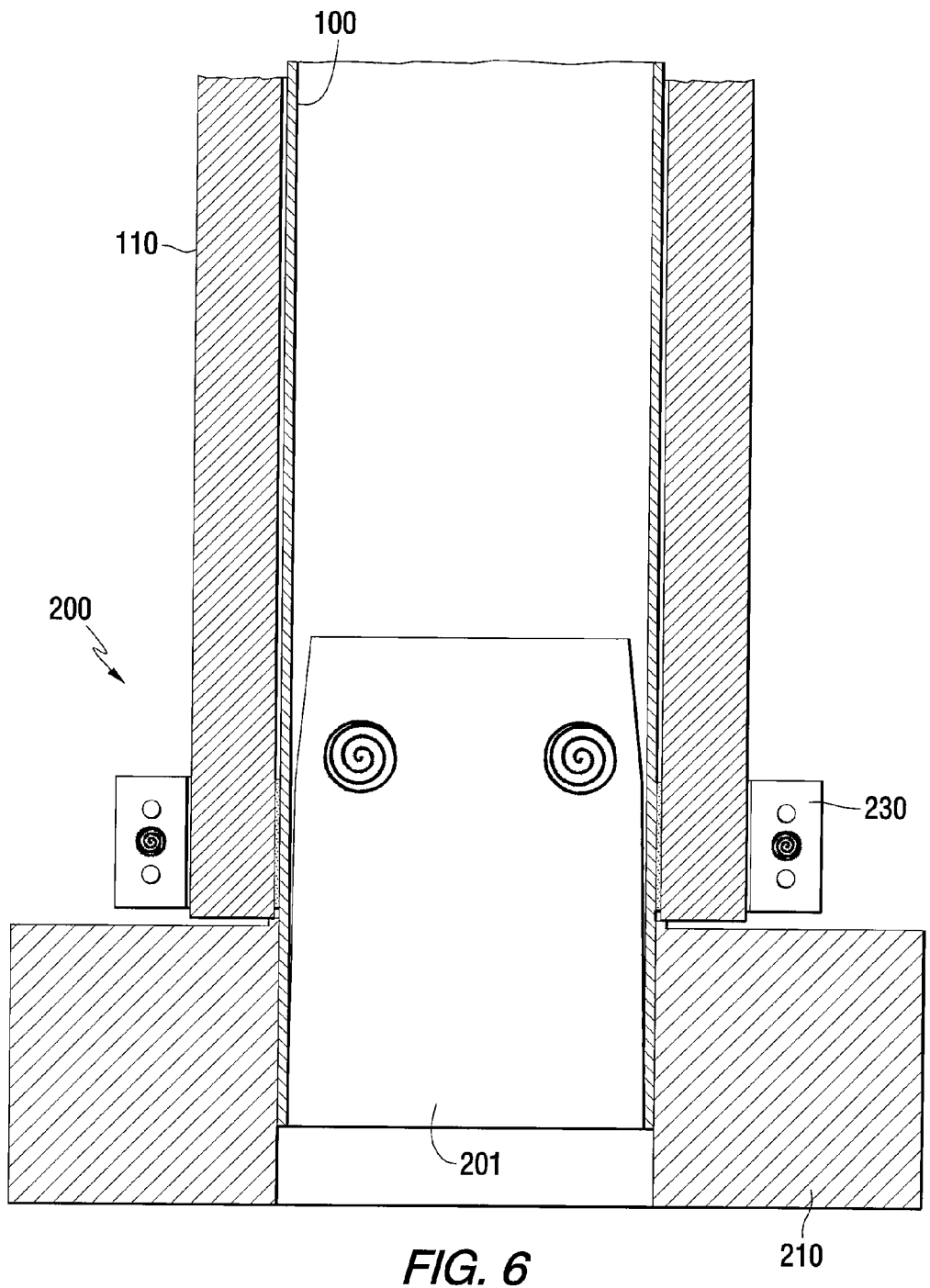
FIG. 6 is a cross-sectional view of a bonding jig according to one embodiment.
Figure 7A:
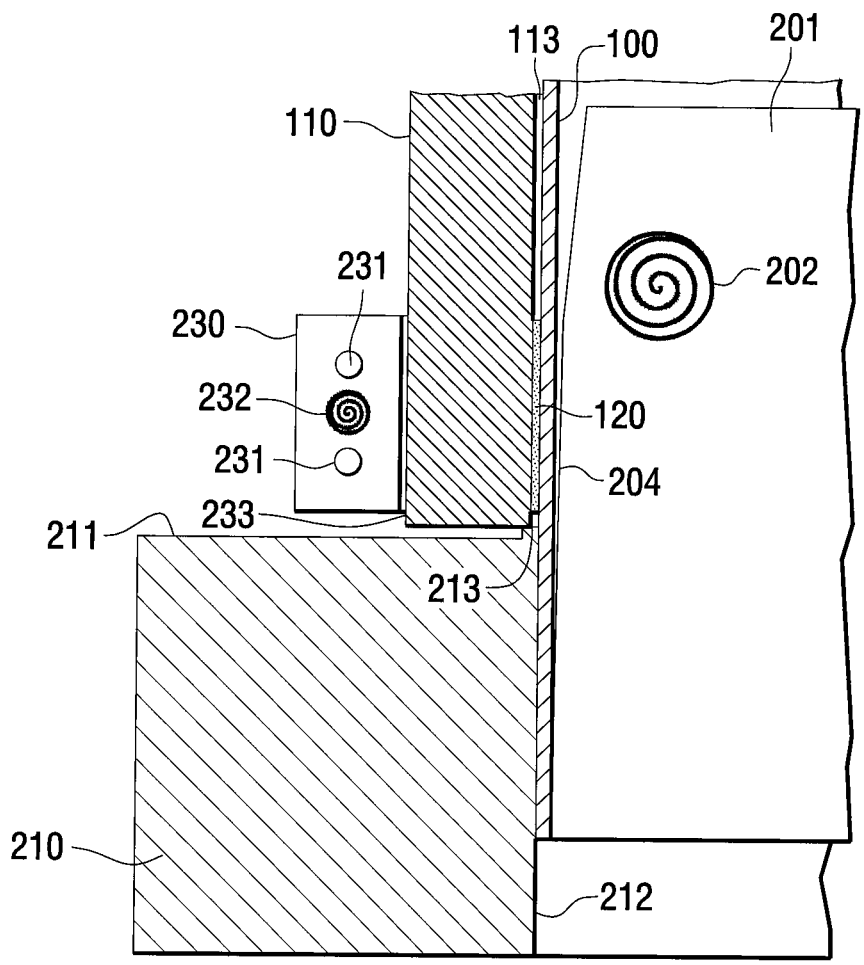
FIG. 7A is an expanded cross-section view of the bonding jig shown in FIG. 6.
Figure 7B:
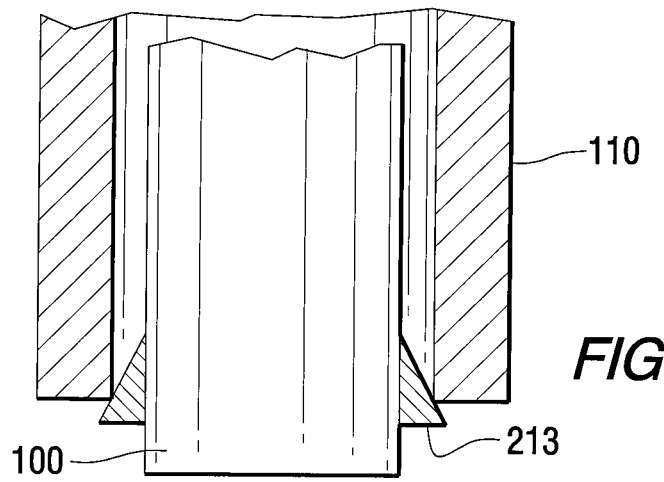
FIG. 7B is an expanded cross-sectional view showing the use of tapered shims.

Referring to FIGS. 6 and 7A-7B, there is shown a bonding jig for bonding the rotary sputtering target to the backing tube. The bonding jig 200 contains a centering base 210 for receiving the backing tube 100. The outer surface of the backing tube 100 fits firmly around the centering base inner diameter 212. Along the upper surface 211 of the centering base 210 is a protruding surface 213. The protruding surface 213 forms a ring extending above the upper surface 211 along the inner diameter 212 of the centering base. In one embodiment the protruding surface tapers away from the inner diameter 212 and terminates at the upper surface 211.

Optionally, a heating plug 201 is inserted inside the diameter of the backing tube 100. The heating plug tapered surface 204 presses against the inner surface of the backing tube 100. The heating plug 201 contains a heating element 202. In one embodiment the heating element 202 is a fluid passageway allowing for the flow of a heated fluid. The heated fluid can be any fluid that facilitates heat transfer such as water or air. It is understood that any suitable fluid can be used to facilitate heat transfer. In another embodiment the heating element 202 is an electronic heating element. Additionally, a variable temperate band 230 may be placed around the target material 110. The variable temperate band optionally having a cooling element 231 and a heating element 232. The inner ring surface 233 rests against the target material to initiate heat transfer. By using both a heating plug 201 on the inner surface of the backing tube 100 and a variable temperature band 230 on the outer surface of the target material 110, the rate and direction of heating and cooling can be manipulated and optimized. This feature allows for the manipulation of thermal and mechanical stresses for backing tubes and target materials that have different coefficients of thermal expansion. In one embodiment, a compression force is applied to the during cooling of the bonding material to increase the bonding strength. Given that the bond is necessary to carry a load, increasing the bond strength is beneficial.

The rotary sputtering target material 110 is placed around the backing tube 100. The rotary sputtering target material 100 rests on the protruding surface 213. In one embodiment the protruding surface 213 has stepped features as shown in FIG. 7A or a tapered surface as shown in FIG. 7B to facilitate centering of the rotary sputtering target material 100 around the backing tube 100. With the rotary sputtering target material 100 resting on the protruding surface 213, a gap 113 is formed between the rotary sputtering target material 100 and the backing tube 100. In one embodiment, the gap is less than 3 mm. In another embodiment, the gap is less than 1 mm.

Bonding material 120 is placed to fill a portion of the gap 112. It is understood that any suitable bonding means can be used. For example, in one embodiment heated bonding material is placed in the top of the gap and flows to the bottom of the rotary sputtering target material 100 creating a layer of bonding material 120. In another embodiment, bonding the protruding surface 213 contains a bonding material injector port (not shown) to allow the flow of bonding material from the protruding surface 213 into the gap 113. In another embodiment the bonding material 120 is applied to the backing tube 100 prior to attachment of the target material 110.

In another embodiment the backing tube 100 is held horizontally and the gap 113 between the backing tube 100 and the target material 110 is formed. The bonding material 120 is placed into the gap 113 proximate the end of the target material 110. The gap 113 is then sealed to prevent movement of the bonding material. The end can be sealed by any suitable means, such as solder, welding or heat resistant tape to keep the bonding material from leaking during the heating process.

In yet another embodiment the backing tube having adhesive ridges similar to those shown in FIG. 11 is used. The ridges are machined or welded along the backing tube to provide self-alignment for the bonding material. The bonding material is then wrapped between the ridges and optionally held into place by soldering or tack welding. The backing tube is then inserted into the target material, the ridges protecting the bonding material from tearing. Once attached the bonding material can be heated to form a bond between the backing tube and the target material.

In one embodiment a variable temperature band 230 is place around the rotary sputtering target material 110. The inner ring surface 233 of the variable temperate band 230 is in contact with the outer surface of the rotary sputtering target material 110. The variable temperature band 230 heats or cools the rotary sputtering target material 110, and thereby the bonding material 120, to facilitate the bonding process. The variable temperature band 203 may contain numerous heating or cooling elements. In one embodiment the variable temperature band 203 contains at least one heating element 232 and at least one cooling element 231. It is understood that the heating and cooling elements can be any device that generates heating or cooling. In one embodiment the heating and cooling elements are fluid passageways allowing for the passage of warm or cool fluids. Alternatively, the heating and cooling elements are electrical heating and cooling devices.

After bonding the first end of the rotary sputtering target material 110, the backing tube 100 and rotary sputtering target material 110 is inverted to bond the second end in the same manner as described above.

Figure 8:
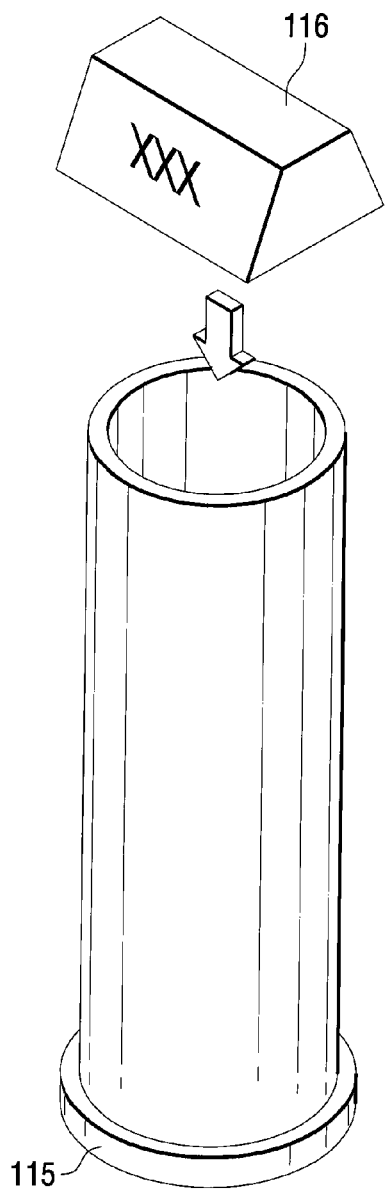
FIG. 8 is a graphical representation of weight being added to compress seal a sealing ring to prevent leakage of the sealing material.
Figure 9:
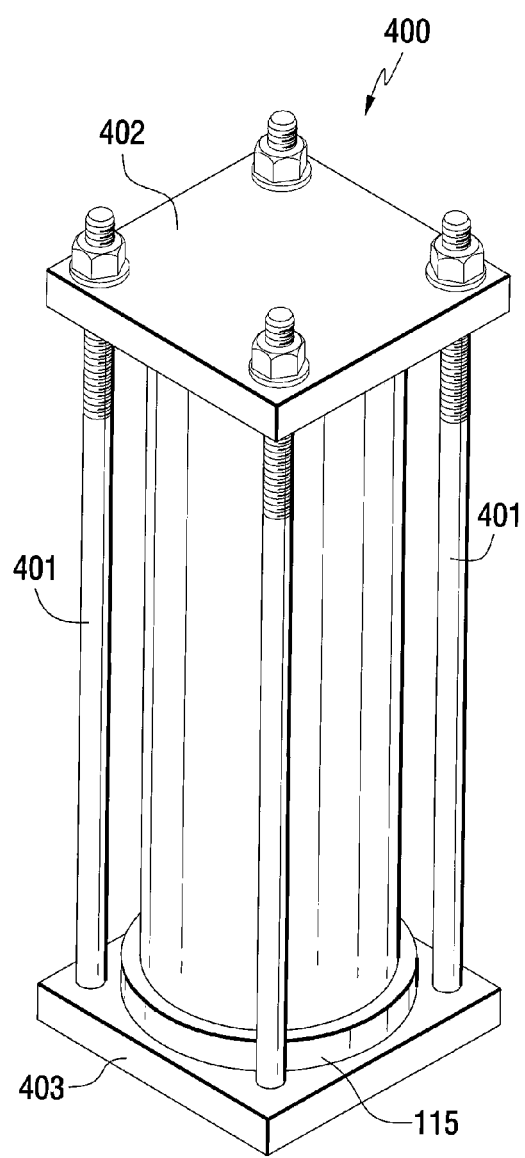
FIG. 9 is a graphical representation of a sealing device having threaded rods to compress a sealing ring.

In one embodiment a sealing force is applied to attack a sealing ring 115 to the backing tube 100. In one embodiment the sealing ring 115 is an elastomer sealing ring. As shown in FIG. 8, a weight 116 is applied to the backing tube 100 to compress and seal the sealing ring. This compression prevents leakage of the sealing material during the sealing process. As shown in FIG. 9, a sealing device 400 having a top plate 402, a bottom plate 403 and a plurality of threaded rods 401 is used to seal the sealing ring 115.

Figure 10:
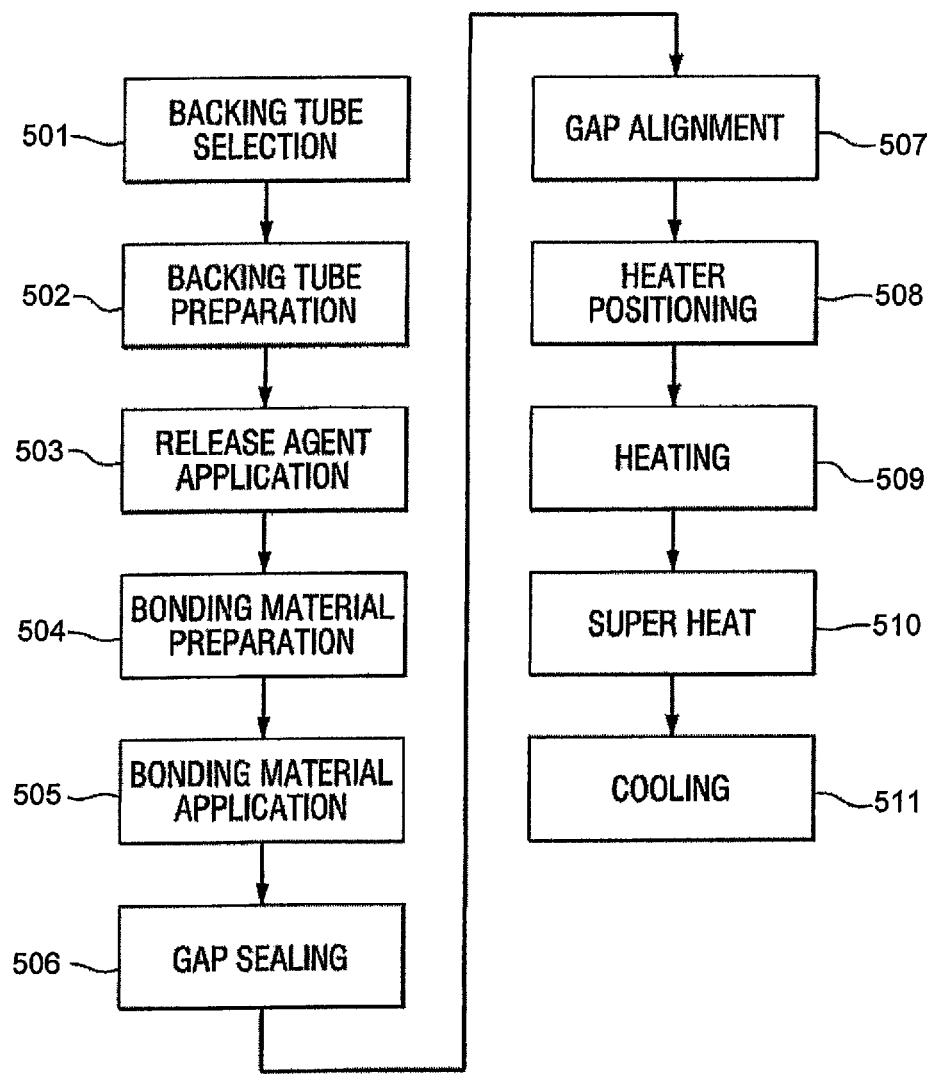
FIG. 10 is a process flow chart for attaching a rotary target material to a backing tube according to one embodiment.

Referring to FIG. 10 there is shown a process flow chart for attaching a rotary target material to a backing tube according to one embodiment. It is understood that some of the process steps include optional process steps and should not be construed as limiting. Backing tube selection 501 consists of selecting a backing tube having the appropriate size, shape and material for the sputtering process.

If the backing tube is not pre-prepared the backing tube is subjected to backing tube preparation 502. The backing tube is cleaned using abrasives and/or cleaning solutions to remove any impurities and prepare the backing tube for bonding. The backing tube can then be plated and wetted with a solder to promote an improved seal. Optionally, the backing tube is subjected to a release agent application 503.

The backing tube is then inserted into the rotary sputtering target and the gap is set during the bonding material prep 504. It is understood that the bonding the gap may be set while the backing tube is in either the horizontal or vertical position. The different techniques for applying the bonding material will dictate the preferred embodiments. It is understood that the gap can be set by several different means. For example, the gap may be set by the use of a shim having a thickness that is close the size of the gap. The shim may take on any suitable shape, such as tapered or square shims.

During the bonding material application 505 bonding material is placed on the backing tube. The bonding material may be placed on the backing tube prior to insertion into the target material or the bonding material may be placed or flowed into the gap created during the bonding material prep 504. Optionally, a backing tube having adhesive ridges is used to keep the bonding material in place.

Optionally, the bonding material is sealed into the gap during the gap sealing 506. The gap may be sealed via soldering, welding or heat resistant tape. The seal should allow the bonding material to stay in place until final bonding.

Once the bonding material is in place the backing tube is placed on the bonding jig during the gap alignment 507. The bonding jig holds the backing tube and target in place. The heater positioning 508 allows a heating element to be placed proximate the bonding material. In one embodiment heater elements are near the inner portion of the backing tube and the outer portion of the target material to get a more even heat transfer to the bonding material. The heating 509 allows the bonding material to melt and thereby create a suitable bond between the backing tube and the target material. Optionally, the heaters super heat 510 the bonding material by bringing the temperature of the bonding material to at least 50° F. above the melting point of the bonding material.

Optionally, during cooling 511 a cooling element is applied to decrease the total cooling time of the bonding material. Once the bonding material has sufficiently cooled, the backing tube assembly is inverted and the second end is bonded in a manner similar to the steps described above.

Figure 12B:
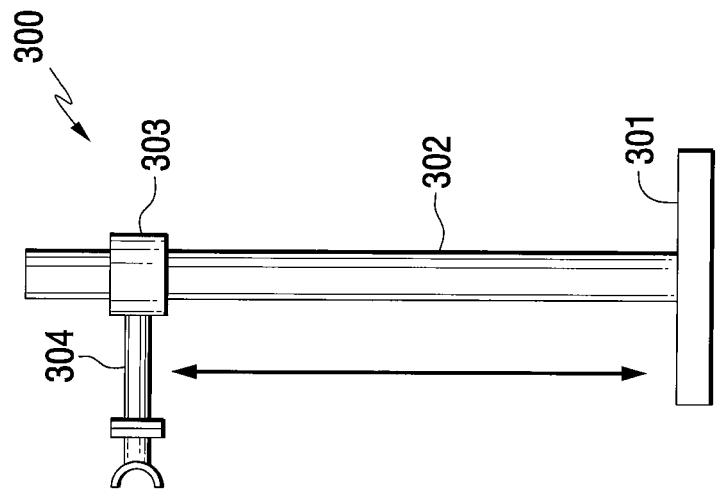
FIGS. 12A-12B are schematic views of a rotating assembly stand according to one embodiment.
Figure 12A:
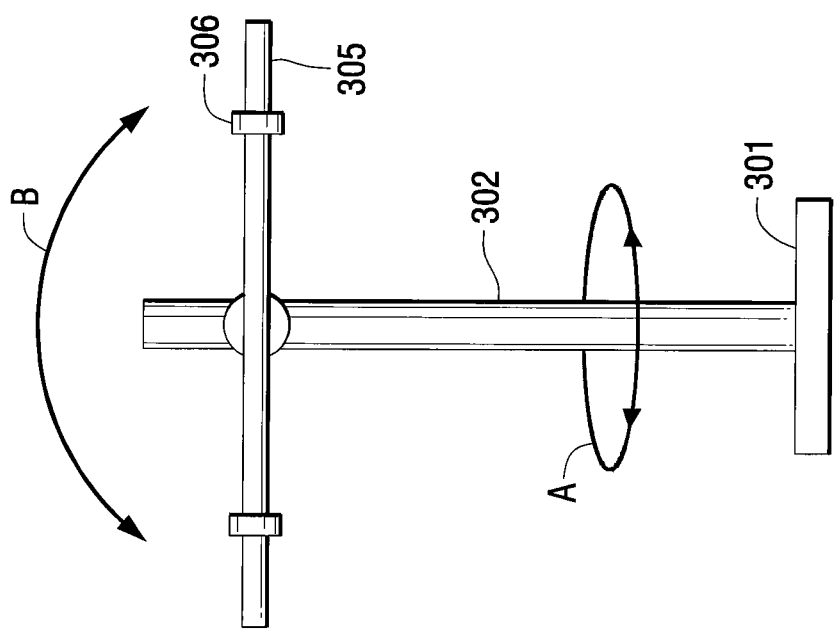

Because of the length, bonded rotary sputtering targets and backing tubes can be cumbersome to manipulate. Referring to FIGS. 12A-12B, there is shown a rotating assembly stand 300. In one embodiment, the rotating assembly stand 300 is a three axis rotating stand allowing vertical, movement and rotation around the assembly base 301 and the collar 303. To facilitate movement around the assembly base 301 the assembly vertical support 302 is attached to allow rotation as shown by the arrows A in FIG. 12A. Additionally, the rotating arm 305 rotates as shown by the arrows B in FIG. 12A. A backing tube support 306 is attached to the rotating arm 305 to hold the backing tube in place. A collar rod 304 as shown in FIG. 12B attaches the rotating arm to the collar 303, the collar 303 being movable attached to the assembly vertical support 302 to allow for vertical movement.

Figure 13:
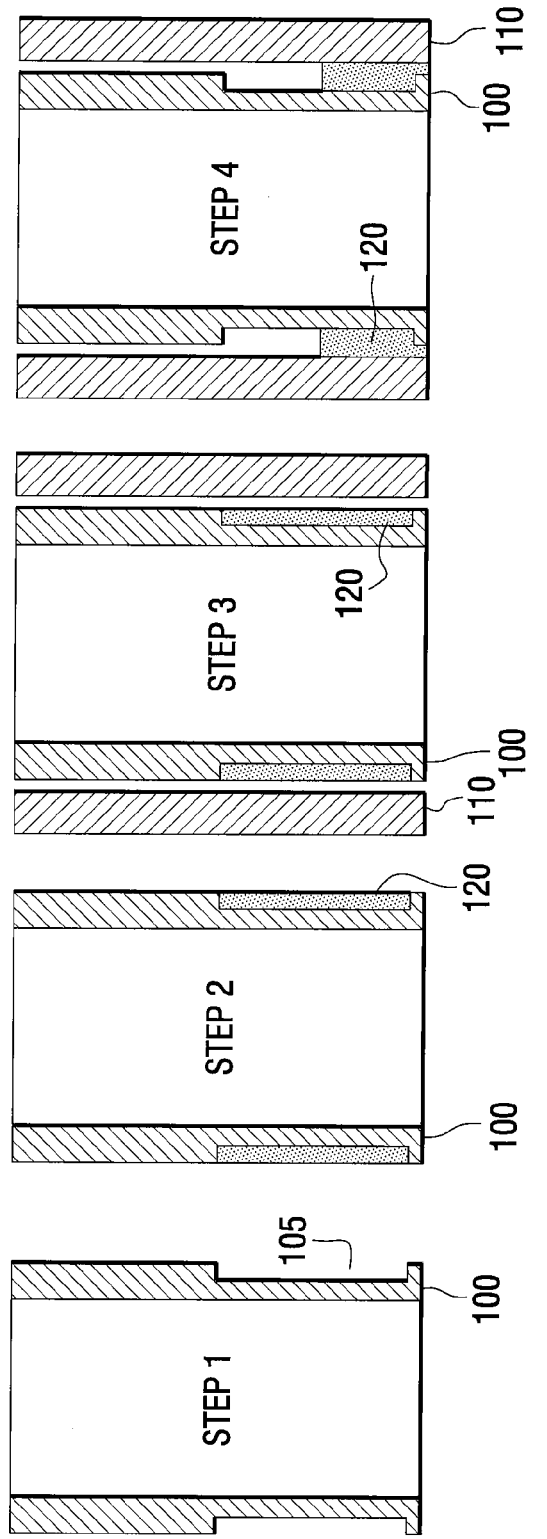
FIG. 13 is a process flow diagram showing the bonding of a target to a backing tube having relief reservoirs according to one embodiment.

Referring now to FIG. 13, there is shown a backing tube 100 having a relief reservoir 105 used to retain bonding material 120. As shown in Step 1, a backing tube 100 is provided having a relief reservoir 105 formed into the circumference of the backing tube 100. It is understood that the relief reservoir can be positioned at one or both ends of the backing tube 120. The bonding material 120 is filled into the relief reservoir 105 as shown in Step 2. Optionally, the relief reservoir is wetted prior to filling to facilitate application of, or flow of the bonding material. The target tube 110 is aligned around the backing tube 100 as shown in Step 3. Heat is then applied to the bonding material 120 thereby allowing the bonding material 120 to flow into and fill the gap formed between the backing tube 100 and the target material 110 as shown in Step 4. In one embodiment, the bonding material melts and gravity pulls the bonding material into the gap. In another embodiment, capillary action pulls the bonding material into the gap. It is understood that heat can be applied to the backing tube, the target material or both to facilitate heating of the bonding material. It is further understood that the length and depth of the relief reservoir may vary based on the design parameters of the system and selection of the materials used for the target and backing tube.

Figure 14:
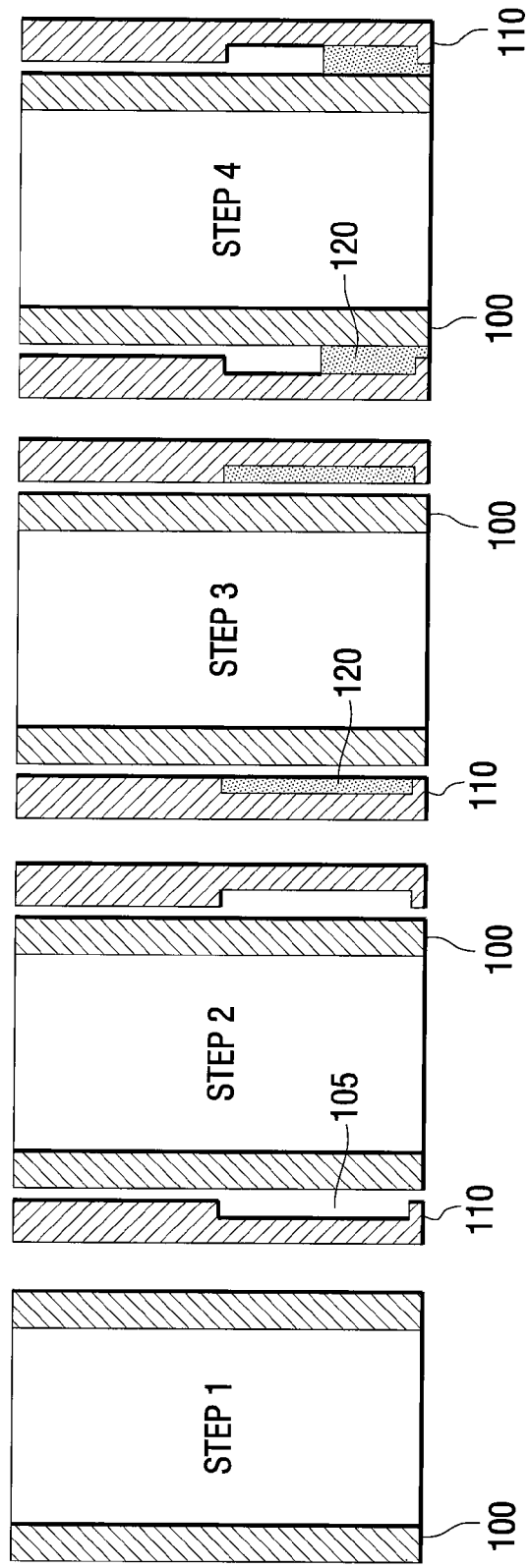
FIG. 14 is a process flow diagram showing the bonding of a target having relief reservoirs to a backing tube according to one embodiment.

Referring now to FIG. 14, there is shown a target tube 110 having a relief reservoir 105 used to retain bonding material 120. As shown in Step 1, a backing tube 100 is provided. A target tube 110 is proved in Step 2 having a relief reservoir 105 formed into the circumference of the target tube 110. It is understood that the relief reservoir can be positioned at one or both ends of the target tube 110. The bonding material 120 is filled into the relief reservoir 105 as shown in Step 2. Optionally, the relief reservoir is wetted prior to filling to facilitate application of, or flow of the bonding material. The target tube 110 is aligned around the backing tube 100 as shown in Step 3. Heat is then applied to the bonding material 120 thereby allowing the bonding material 120 to flow into and fill the gap formed between the backing tube 100 and the target material 110 as shown in Step 4. In one embodiment, the bonding material melts and gravity pulls the bonding material into the gap. In another embodiment, capillary action pulls the bonding material into the gap. It is understood that heat can be applied to the backing tube, the target material or both to facilitate heating of the bonding material. It is further understood that the length and depth of the relief reservoir may vary based on the design parameters of the system and selection of the materials used for the target and backing tube.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

PARTS LIST

100 Backing tube
101 End collar
102 Seam
103 Perforation
104 Exposed backing tube
105 Relief reservoir
110 Target material
111 Target first end
112 Target second end
113 Gap
114 Target inner surface
115 Sealing ring
116 Weight
120 Target bonding material
200 Bonding jig
201 Heating plug
202 Heating element
203 Heating plug tapered surface
204 Heating plug sidewall
210 Centering base
211 Centering base upper surface
212 Centering base inner diameter
213 Centering base protruding surface
220 Variable temperate band
221 Band cooling element
222 Band heating element
223 Band inner ring surface
300 Rotating assembly stand
301 Assembly base
302 Assembly vertical support
303 Collar
304 Collar rod
305 Rotating arm
306 Backing tube support
400 Sealing device
401 Threaded rod
402 Top plate
403 Bottom plate
901 Backing tube
902 Adhesive ridges
903 Adhesive
904 target

The invention claimed is:
1. A rotary sputtering target assembly comprising:
a backing tube having a length and an outer surface at an outer diameter;
a rotary sputtering target of a malleable material having a high weight to strength ratio, the sputtering target placed over the backing tube and having a length less than the length of said backing tube and an inner surface at an inner diameter greater than the outer diameter of the backing tube;

a bonding material or sealing layer adhered to the inner diameter of the said rotary sputtering target and the outer diameter of said backing tube only proximate both ends of the sputtering target such that the bonding material or sealing layer is discontinuous along the outer surface of the backing tube creating both a fluid resistance vacuum seal and a continuous annular and open gap between the outer surface of the backing tube and the inner surface of the sputtering target and extending along the remainder of the length and periphery of the backing tube between the bonded or sealed ends of the sputtering target; the backing tube further being perforated in at least the entire periphery and length of the backing tube between the bonded or sealed ends, the gap being in fluid communication with the interior of the backing tube through the perforated backing tube to allow for cooling fluid during sputtering to flow through the gap and directly contact the entire inner surface of the sputtering target between the sputtering target ends, thereby to allow for more of the sputtering target to be sputtered without deformation of the sputtering target at high rates and to allow the spent sputtering target to be readily removed from the backing tube after use.

2. The rotary sputtering target of claim 1 further comprising an annular relief reservoir receded into and proximate both ends of either or both the outside diameter of said backing tube and the inner diameter of said rotary sputtering target to define the length of the bonded or sealed ends and receive the bonding material or sealing layer.

3. The rotary sputtering target assembly of claim 1, wherein the gap is defined by the outer surface of the backing tube with the bonding material or sealing layer applied on substantially the entire periphery proximate each of the sputtering target ends to less than about one-third of the length of the sputtering.

4. The rotary sputtering target assembly of claim 1, wherein the gap has a uniform depth of less than 3 mm.

5. The rotary sputtering target assembly of claim 1 and further comprising two spaced ridges proximate each end of the perforated backing tube, the ridges engaging the inner surface of the sputtering target to define the depth of the gap and retaining the bonding material or sealing layer in the space between the two ridges.

6. The rotary sputtering target assembly of claim 1, wherein the bonding material or sealing layer is selected from the group consisting of bismuth materials, foils, indium, indium/tin, and silver/tin; and/or the sputtering target is selected from the group consisting of alloys, mixtures, pure metals, ceramics, oxides, nitrides, borides, carbides, fluorides and sulfides.

7. The rotary sputtering target assembly of claim 1, wherein the backing tube is of a vacuum compatible non-magnetic material and the sputtering target has a length within a range from about 6" to about 152", an inner diameter within a range from about 2" to about 6" and an outer diameter from about 4" to about 9".

8. The rotary sputtering target assembly of claim 1, wherein the backing tube is coated with a release agent where the bonding material or sealing layer is applied, to facilitate the release of the sputtering target from the backing tube after use in sputtering, the release agent selected from the group consisting of bees wax, graphite based alcohols, graphite based paints, and dry graphite lubricants.

9. The rotary sputtering target assembly of claim 1, assembled in bonding or sealing jig comprising a centering base in which an end of the backing tube is firmly positioned and on the top surface of which centering base may be positioned a sputtering target placed over the backing tube, the top surface of the centering base including a protruding surface positioned between the backing tube outer surface and the sputtering target inner surface to define the annular gap; and a variable temperature band situated above the centering base and in contact with outer surface of the sputtering target where the bond or seal is to be made.

10. The rotary sputtering target assembly of claim 9 and in which the bonding or sealing jig further comprises a dedicated heating element and a dedicated cooling element contained within the variable temperature band, each of the heating and/or cooling elements comprising either an electronic heating element of fluid passages for a heated or cooled fluid to pass through the temperature band.

11. The rotary sputtering target assembly of claim 10 and in which the bonding or sealing jig further comprises a heating plug positioned internally of the backing tube and in contact with the inner surface of the backing tube where the bond or seal is to be made.

12. The rotary sputtering target assembly of claim 1, assembled by placing at least one end each of the backing tube and the sputtering target in a bonding or sealing jig with a continuous gap of 3 mm or less between the backing tube and the sputtering target, adding a bonding or sealing layer in the gap between the backing tube and the sputtering target proximate to the sputtering target end only in an amount to cover less than one-third the length of the sputtering target, the bonding or sealing layer depending on its composition and form to be added either before or after placing the one end of the sputtering target in the jig, and applying power to the jig to form the bond or seal by heating the bonding material or sealing layer.

13. The rotary sputtering target assembly according to claim 1, as assembled in a backing tube stand comprising a base, a vertical support rotatably mounted on the base; a horizontal collar attached at one end to the vertical support and movable vertically along the length of the vertical support to accommodate a variety of lengths of rotary sputtering target assemblies, a rotatable arm attached to the other end of the collar, and means on the rotatable arm for holding for assembly the backing tube, the bonding or sealing material and the sputtering target.

14. The rotary sputtering target assembly of claim 1, wherein the gap is defined by the outer surface of the backing tube with the bonding material or sealing layer applied on substantially the entire periphery proximate each of the sputtering target ends only to less than about one-fifth of the length of the sputtering target.

15. The rotary sputtering target assembly of claim 1, wherein the gap has a uniform depth of less than 1 mm.

* * * * *